(12) United States Patent
Miyahara

(10) Patent No.: US 10,637,429 B2
(45) Date of Patent: Apr. 28, 2020

(54) ELECTRONIC COMPONENT

(71) Applicant: Murata Manufacturing Co., Ltd., Nagaokakyo-shi, Kyoto-fu (JP)

(72) Inventor: Kunihiro Miyahara, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/052,673

(22) Filed: Aug. 2, 2018

(65) Prior Publication Data

US 2018/0351529 A1 Dec. 6, 2018

Related U.S. Application Data

(63) Continuation of application No. PCT/JP2017/003886, filed on Feb. 3, 2017.

(30) Foreign Application Priority Data

Mar. 31, 2016 (JP) .................. 2016-071080

(51) Int. Cl.
*H03H 7/01* (2006.01)
*H01G 4/40* (2006.01)
*H01F 27/29* (2006.01)
*H01F 17/00* (2006.01)
(Continued)

(52) U.S. Cl.
CPC ....... *H03H 7/0115* (2013.01); *H01F 17/0013* (2013.01); *H01F 27/00* (2013.01);
(Continued)

(58) Field of Classification Search
CPC ......... H03H 7/0115; H03H 2001/0085; H03H 7/075; H03H 7/1766
(Continued)

(56) References Cited

U.S. PATENT DOCUMENTS 5,945,892 A    8/1999 Kato et al.
6,542,052 B2 *  4/2003 Matsumura ............. H03H 3/00
                                                333/175
(Continued)

FOREIGN PATENT DOCUMENTS

JP    2001-267141 A    9/2001
JP    2002-076807 A    3/2002
(Continued)

OTHER PUBLICATIONS

Official Communication issued in International Patent Application No. PCT/JP2017/003886, dated Apr. 11, 2017.

*Primary Examiner* — Rakesh B Patel
(74) *Attorney, Agent, or Firm* — Keating & Bennett, LLP

(57) ABSTRACT

An electronic component includes a multilayer body including insulator layers laminated in a lamination direction, a side surface electrode provided on a side surface defined by contiguous outer edges of the insulator layers, and connected to a ground potential, at least one conductor layer provided on the insulator layers, a shield conductor layer provided on the insulator layer that is different from the insulator layer on which the inner conductor layer is provided, and overlapping with the inner conductor layer when viewed from the lamination direction, a first lead conductor layer provided on the insulator layer that is different from the insulator layer on which the shield conductor layer is provided, and connected to the side surface electrode, and a first interlayer connection conductor passing through least one of the insulator layers in the lamination direction to connect the shield conductor layer and the first lead conductor layer.

18 Claims, 8 Drawing Sheets

(51) Int. Cl.
  *H01G 4/232* (2006.01)
  *H01G 4/30* (2006.01)
  *H01F 27/00* (2006.01)
  *H03H 7/075* (2006.01)
  *H01G 4/12* (2006.01)
  *H03H 1/00* (2006.01)

(52) U.S. Cl.
  CPC ............. *H01F 27/29* (2013.01); *H01G 4/232* (2013.01); *H01G 4/30* (2013.01); *H01G 4/40* (2013.01); *H03H 7/075* (2013.01); *H03H 7/1766* (2013.01); *H01F 2017/0026* (2013.01); *H01G 4/12* (2013.01); *H03H 2001/0085* (2013.01)

(58) Field of Classification Search
  USPC .................................................. 333/175, 185
  See application file for complete search history.

(56) References Cited

U.S. PATENT DOCUMENTS

| | | |
|---|---|---|
| 2003/0147197 A1 | 8/2003 | Uriu et al. |
| 2007/0085108 A1 | 4/2007 | White et al. |
| 2010/0123526 A1 | 5/2010 | Okada et al. |
| 2017/0032896 A1* | 2/2017 | Otani ................ H01G 4/30 |
| 2017/0170800 A1* | 6/2017 | Saito ................ H01F 19/06 |

FOREIGN PATENT DOCUMENTS

| | | |
|---|---|---|
| JP | 3501327 B2 | 3/2004 |
| JP | 2010-114899 A | 5/2010 |
| JP | 2010-124018 A | 6/2010 |
| WO | 01/69710 A1 | 9/2001 |

* cited by examiner

US 10,637,429 B2

ELECTRONIC COMPONENT

CROSS REFERENCE TO RELATED APPLICATIONS

This application claims the benefit of priority to Japanese Patent Application No. 2016-071080 filed on Mar. 31, 2016 and is a Continuation Application of PCT Application No. PCT/JP2017/003886 filed on Feb. 3, 2017. The entire contents of each application are hereby incorporated herein by reference.

BACKGROUND OF THE INVENTION

1. Field of the Invention

The present invention relates to a multilayer electronic component.

2. Description of the Related Art

A multilayer LC composite component disclosed in Japanese Unexamined Patent Application Publication No. 2002-76807 is known as an example of a previous invention regarding an electronic component, for example. The multilayer LC composite component includes a multilayer body, a plurality of LC resonators, and a ground pattern. The multilayer body includes a plurality of insulator layers that are stacked. The plurality of LC resonators are configured of a plurality of conductor layers and via hole conductors. Additionally, the ground pattern is provided on the uppermost insulator layer, and covers almost the entire surface of an upper surface of the insulator layer. A ground potential is connected to the ground pattern. This suppresses noise from entering the multilayer LC composite component, and suppresses noise from being radiated outside the multilayer LC composite component.

Incidentally, in a case in which the multilayer LC composite component disclosed in Japanese Unexamined Patent Application Publication No. 2002-76807 is used as a filter, there is demand to adjust a frequency or an attenuation of an attenuation pole in a bandpass characteristic. In order to respond to such demand, a passive circuit element may be newly provided, which leads to an increase in size of the component.

SUMMARY OF THE INVENTION

Preferred embodiments of the present invention provide electronic components that are each capable of being reduced in size and in which a frequency or an attenuation of an attenuation pole is capable of being adjusted.

An electronic component according to a preferred embodiment of the present invention includes a multilayer body including a plurality of insulator layers that are laminated in a lamination direction; a side surface electrode provided on a side surface defined by contiguous outer edges of the plurality of insulator layers in the multilayer body, and connected to a ground potential; at least one inner conductor layer provided on the insulator layers; a shield conductor layer provided on the insulator layer that is different from the insulator layer on which the at least one inner conductor layers are provided, and overlapping with the inner conductor layer when viewed from the lamination direction; a first lead conductor layer provided on the insulator layer that is different from the insulator layer on which the shield conductor layer is provided, and connected to the side surface electrode; and a first interlayer connection conductor passing through one or more of the insulator layers among the plurality of insulator layers in the lamination direction to connect the shield conductor layer and the first lead conductor layer.

According to preferred embodiments of the present invention, it is possible to reduce the size and adjust a frequency or an attenuation of an attenuation pole of electronic components.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
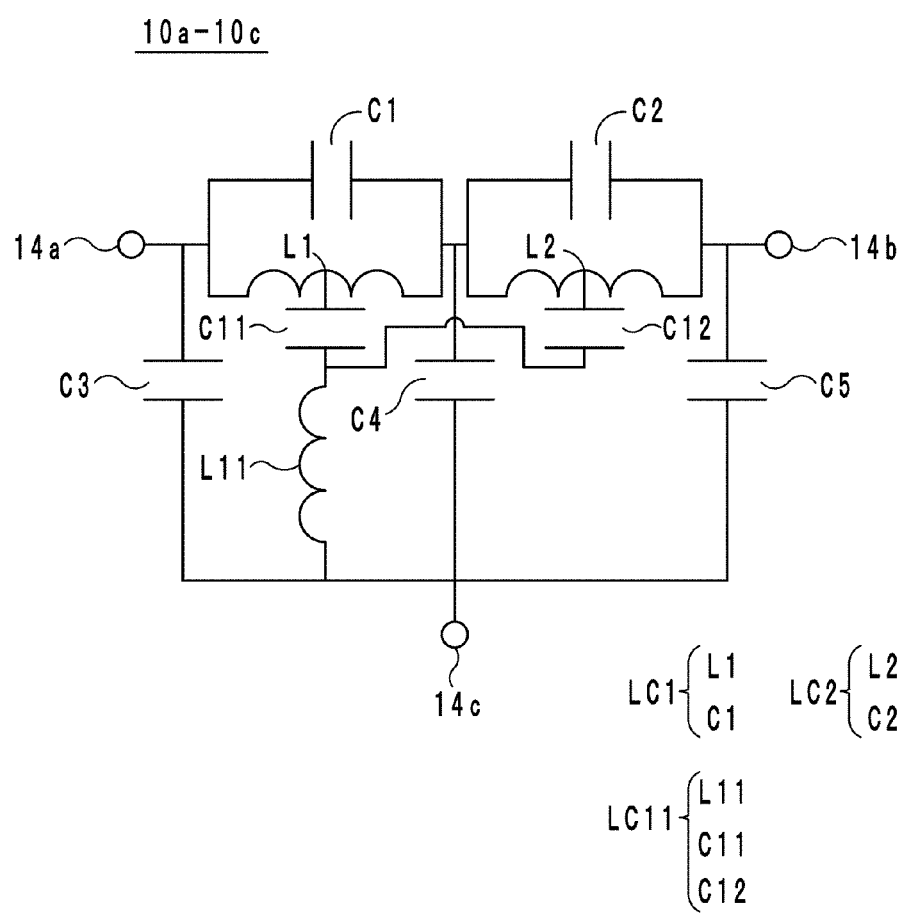
FIG. 1A is an equivalent circuit diagram of electronic components 10a to 10c according to a preferred embodiment of the present invention.

Hereinafter, electronic components according to preferred embodiments of the present invention will be described with reference to the drawings. FIG. 1A is an equivalent circuit diagram of the electronic components 10a to 10c according to preferred embodiments of the present invention.

The electronic component 10a includes a low pass filter including a plurality of passive elements, and, as illustrated in FIG. 1A, includes LC parallel resonators LC1 and LC2, an LC serial resonator LC11, capacitors C3 to C5, and outer electrodes 14a to 14c (an example of one or more outer electrodes). The outer electrodes 14a and 14b are input and output outer electrodes through which a high-frequency signal is input and output, and the outer electrode 14c is a ground outer electrode connected to a ground potential.

The LC parallel resonators LC1 and LC2 are connected in series in this order between the outer electrode 14a and the outer electrode 14b. The LC parallel resonator LC1 includes an inductor L1 (an example of a passive element) and a capacitor C1 (an example of a passive element). The inductor L1 and the capacitor C1 are connected in parallel to each other. The LC parallel resonator LC2 includes an inductor L2 (an example of a passive element) and a capacitor C2 (an example of a passive element). The inductor L2 and the capacitor C2 are connected in parallel to each other.

The LC serial resonator LC11 is connected between the inductors L1 and L2 and the outer electrode 14c. To be more specific, the LC serial resonator LC11 includes an inductor L11 and capacitors C11 and C12. One electrode of the capacitor C11 is connected to the inductor L1. One electrode of the capacitor C12 is connected to the inductor L2. The other electrode of the capacitor C11 and the other electrode of the capacitor C12 are connected to each other. Additionally, one end portion of the inductor L11 and the other electrode of the capacitor C11 and the other electrode of the capacitor C12 are connected in series to each other. In other words, the inductor L11 and the capacitor C11 are connected in series, and the inductor L11 and the capacitor C12 are connected in series. Additionally, the other end portion of the inductor L11 is connected to the outer electrode 14c.

One electrode of the capacitor C3 is connected to the outer electrode 14a, and the other electrode of the capacitor C3 is connected to the outer electrode 14c. One electrode of the capacitor C4 is connected between the LC parallel resonator LC1 and the LC parallel resonator LC2, and the other electrode of the capacitor C4 is connected to the outer electrode 14c. One electrode of the capacitor C5 is connected to the outer electrode 14b, and the other electrode of the capacitor C5 is connected to the outer electrode 14c.

Figure 1B:
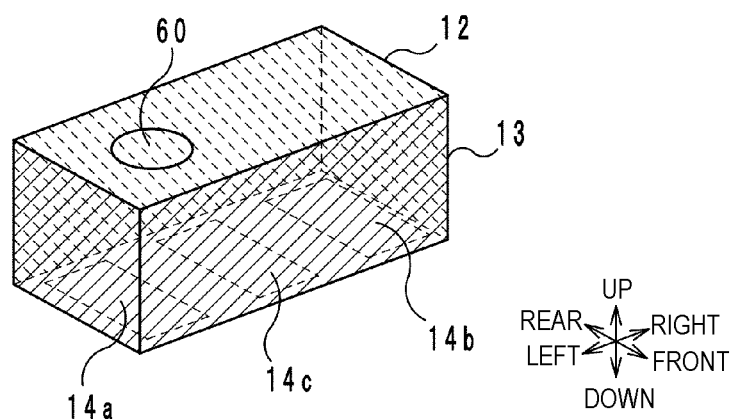
FIG. 1B is an outer appearance perspective view of the electronic components 10a and 10c according to a preferred embodiment of the present invention.
Figure 2A:
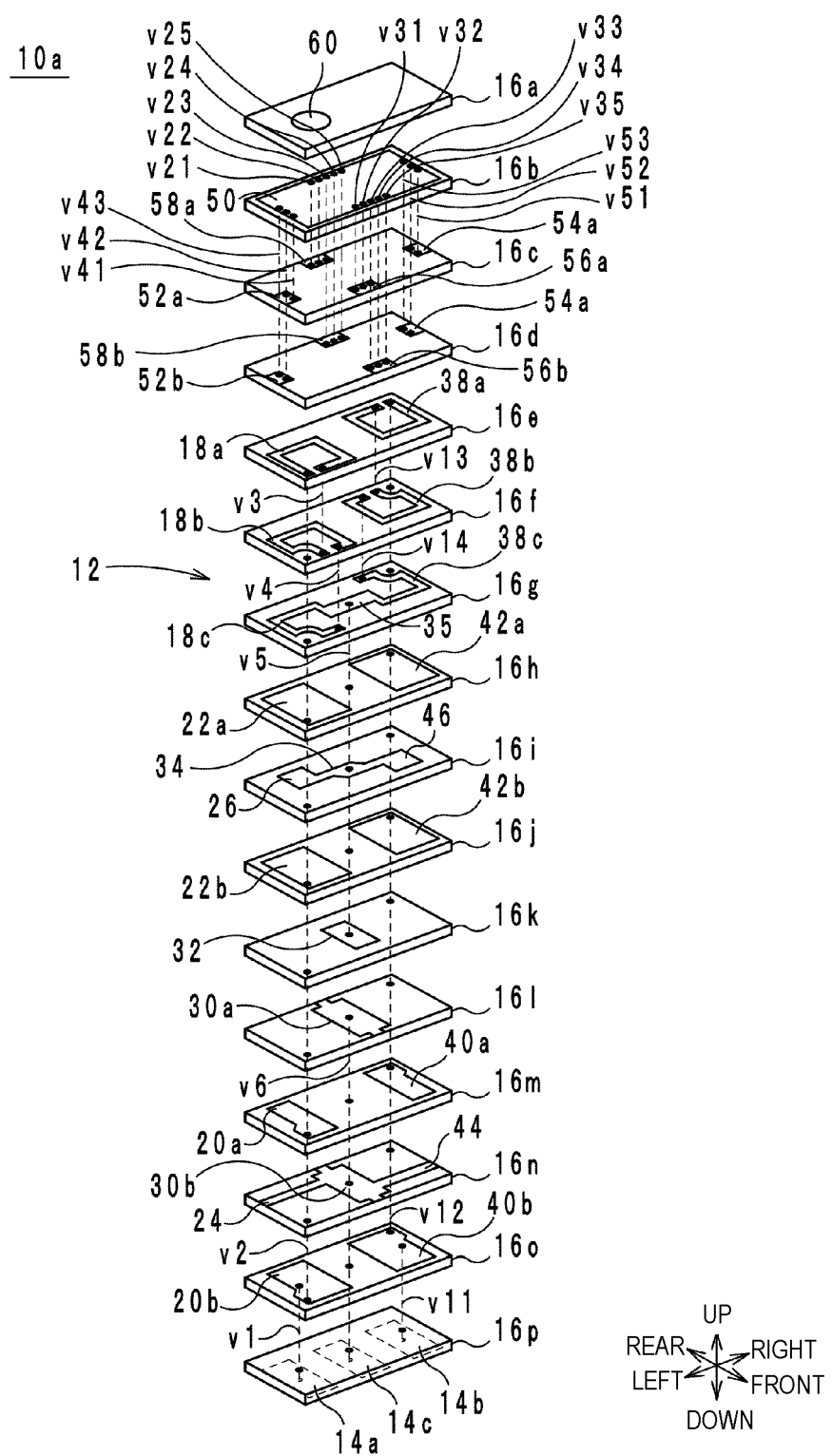
FIG. 2A is an exploded perspective view of an electronic component 10a according to a preferred embodiment of the present invention.

Next, the specific configuration of the electronic component 10a will be described with reference to the drawings. FIG. 1B is an outer appearance perspective view of the electronic components 10a and 10c. FIG. 2A is an exploded perspective view of the electronic component 10a. In the following, a lamination direction of the electronic component 10a is defined as an up-down direction. When viewed from above, a direction in which long sides of the electronic component 10a extend is defined as a left-right direction. When viewed from above, a direction in which short sides of the electronic component 10a extend is defined as a front-rear direction. The up-down direction, the left-right direction, and the front-rear direction are orthogonal or substantially orthogonal to one another. Note that, the up-down direction, the left-right direction, and the front-rear direction in FIG. 1B and FIG. 2A are examples, and need not be the same as the up-down direction, the left-right direction, and the front-rear direction during actual use of the electronic component 10a.

The electronic component 10a includes, as illustrated in FIG. 1B and FIG. 2A, a multilayer body 12, a shield electrode 13, the outer electrodes 14a to 14c, inductor conductor layers 18a to 18c and 38a to 38c, capacitor conductor layers 20a, 20b, 22a, 22b, 26, 32, 40a, 40b, 42a, 42b, and 46, connection conductor layers 34 and 35, ground conductor layers 24, 30a, 30b, and 44, a shield conductor layer 50, lead conductor layers 52a, 52b, 54a, 54b, 56a, 56b, 58a, and 58b, a direction identification mark 60, and via hole conductors v1 to v6, v11 to v14, v21 to v25, v31 to v35, v41 to v43, and v51 to v53.

As illustrated in FIG. 2A, the multilayer body 12 includes insulator layers 16a to 16p (an example of a plurality of insulator layers) being laminated so as to be aligned in this order from an upper side toward a lower side, and has a rectangular or substantially rectangular parallelepiped shape. Although not illustrated in FIG. 2A, the multilayer body 12 is preferably chamfered through barrel finishing, for example. Accordingly, corners and ridge lines of the multilayer body 12 are rounded. The multilayer body 12 includes an upper surface, a bottom surface, and four side surfaces (a front surface, a rear surface, a right surface, and a left surface). The four side surfaces are surfaces that are defined by contiguous outer edges of the insulator layers 16a to 16p in the multilayer body 12, and are adjacent to the bottom surface. The bottom surface positioned at the lower side (an example of one side in the lamination direction) in the multilayer body 12 is a mounting surface. The mounting surface refers to a surface opposing a circuit substrate when the electronic component 10a is mounted on the circuit substrate. The insulator layers 16a to 16p are preferably dielectric layers each having a rectangular or substantially rectangular shape with two long sides and two short sides when viewed from above. The two long sides of the respective insulator layers 16a to 16p are parallel or substantially parallel to each other. The two short sides of the insulator layers 16a to 16p are orthogonal or substantially orthogonal to the two long sides of the insulator layers 16a to 16p. Hereinafter, a main surface of each of the insulator layers 16a to 16p on the upper side is referred to as a top surface, and a main surface of each of the insulator layers 16a to 16p on a lower side is referred to as a back surface.

The outer electrodes 14a, 14c, and 14b are rectangular or substantially rectangular in shape, and are aligned in this order from the left side to the right side at the bottom surface of the multilayer body 12. The outer electrodes 14a to 14c are provided only on the bottom surface of the multilayer body 12, and are not provided on the front surface, the rear surface, the left surface, and the right surface of the multilayer body 12. The outer electrodes 14a to 14c are preferably produced by Ni plating and Sn plating or Au plating on a base electrode of Ag or Cu, for example.

The shield electrode 13 (an example of a side surface electrode) is provided on the four side surfaces of the multilayer body 12 (the front surface, the rear surface, the right surface, and the left surface), and, in the present preferred embodiment, provides a rectangular or substantially rectangular cylindrical shape by covering the entire or almost the entire surfaces of the four side surfaces of the multilayer body 12. With this configuration, a portion provided on the front surface of the shield electrode 13 and a portion provided on the left surface of the shield electrode 13 are connected at a ridge line of the front surface and the left surface. A portion provided on the left surface of the shield electrode 13 and a portion provided on the rear surface of the shield electrode 13 are connected at a ridge line of the left surface and the rear surface. A portion provided on the rear surface of the shield electrode 13 and a portion provided on the right surface of the shield electrode 13 are connected at a ridge line of the rear surface and the right surface. A portion provided on the right surface of the shield electrode 13 and a portion provided on the front surface of the shield electrode 13 are connected at a ridge line of the right surface and the front surface. Note that, the shield electrode 13 is not provided on the upper surface and the bottom surface of the multilayer body 12.

Additionally, the shield electrode 13 is not physically connected to any of the outer electrodes 14a to 14c on the surface of the multilayer body 12 (that is, the upper surface, the bottom surface, the front surface, the rear surface, the right surface, and the left surface). Accordingly, as illustrated in FIG. 1B, on the bottom surface of the multilayer body 12, there is a gap, in which a conductor is not provided, between the shield electrode 13 and each of the outer electrodes 14a to 14c. The shield electrode 13 as described above is preferably produced, for example, by applying a conductive paste, such as Ag or other suitable material to the four side surfaces of the multilayer body 12. Additionally, the shield electrode 13 is preferably produced, for example, by forming a metal film, such as Cu, stainless steel, and other suitable materials on the four side surfaces of the multilayer body 12 by a sputtering method. In a case in which the shield electrode 13 is produced by the sputtering method, the upper surface and the bottom surface of the multilayer body 12 are masked.

The capacitor C3 includes the capacitor conductor layers 20a and 20b and the ground conductor layer 24 (an example of an inner conductor layer). The capacitor conductor layers 20a and 20b are rectangular or substantially rectangular conductor layers provided on left-half regions of the top surfaces of the insulator layers 16m and 16o, respectively. The capacitor conductor layers 20a and 20b overlap with each other when viewed from above.

The ground conductor layer 24 is provided on a left-half region of the top surface of the insulator layer 16n. The ground conductor layer 24 overlaps with the capacitor conductor layers 20a and 20b when viewed from above. With this configuration, the ground conductor layer 24 opposes the capacitor conductor layer 20a with the insulator layer 16m interposed therebetween, and opposes the capacitor conductor layer 20b with the insulator layer 16n interposed therebetween.

Additionally, a left end of the ground conductor layer 24 is positioned at a short side of the insulator layer 16n on a left side when viewed from above. With this configuration, the left end of the ground conductor layer 24 is exposed outside the multilayer body 12 at the left surface of the multilayer body 12, and connected to the shield electrode 13.

One electrode of the capacitor C3 (the capacitor conductor layers 20a and 20b) is connected to the outer electrode 14a with the via hole conductors v1 and v2 interposed therebetween. The via hole conductor v1 passes through the insulator layers 16o and 16p in the up-down direction, and connects the capacitor conductor layer 20b and the outer electrode 14a. The via hole conductor v2 passes through the insulator layers 16e to 16n in the up-down direction, and connects the capacitor conductor layer 20a and the capacitor conductor layer 20b. With this configuration, the outer electrode 14a and the capacitor conductor layers 20a and 20b are electrically connected.

The other electrode of the capacitor C3 (the ground conductor layer 24) is connected to the outer electrode 14c with the ground conductor layer 30b and the via hole conductor v6 interposed therebetween. The ground conductor layer 30b is a rectangular or substantially rectangular conductor layer provided at the center or approximate center on the top surface of the insulator layer 16n. A right end of the ground conductor layer 24 is connected to the ground conductor layer 30b. The via hole conductor v6 passes through the insulator layers 16l to 16p in the up-down direction, and connects the ground conductor layer 30b and the outer electrode 14c. With this configuration, the outer electrode 14c and the ground conductor layer 24 are electrically connected to each other.

Additionally, the ground conductor layer 30b is led out to a long side on the front side and a long side on the rear side of the insulator layer 16n. With this configuration, the ground conductor layer 30b is exposed outside the multilayer body 12 at the front surface and the rear surface of the multilayer body 12, and connected to the shield electrode 13.

As described above, the ground conductor layers 24 and 30b and the via hole conductor v6 electrically connect the shield electrode 13 and the outer electrode 14c.

The inductor L1 includes the inductor conductor layers 18a to 18c (an example of an inner conductor layer) and the via hole conductors v3 and v4. The inductor conductor layers 18a to 18c are linear conductor layers, provided on left-half regions of the top surfaces of the insulator layers 16e to 16g, respectively, that provide shapes in which a rectangular or substantially rectangular annular shape is partially cut out. When viewed from above, the inductor conductor layers 18a to 18c overlap with one another and define a rectangular or substantially rectangular annular path. Hereinafter, an end portion of each of the inductor conductor layers 18a to 18c on an upstream side in the clockwise direction will be referred to as an upstream end, and an end portion of each of the inductor conductor layers 18a to 18c on a downstream side in the clockwise direction will be referred to as a downstream end.

The via hole conductor v3 passes through the insulator layer 16e in the up-down direction, and connects a downstream end of the inductor conductor layer 18a and an upstream end of the inductor conductor layer 18b. The via hole conductor v4 passes through the insulator layer 16f in the up-down direction, and connects a downstream end of the inductor conductor layer 18b and an upstream end of the inductor conductor layer 18c. With this configuration, when viewed from above, the inductor L1 has a spiral shape that progresses from the upper side toward the lower side while winding in the clockwise direction.

The capacitor C1 includes the capacitor conductor layers 22a, 22b, and 26 (an example of an inner conductor layer). The capacitor conductor layers 22a and 22b are rectangular or substantially rectangular conductor layers provided on left-half regions of the top surfaces of the insulator layers 16h and 16j, respectively. The capacitor conductor layers 22a and 22b preferably have the same or substantially the same shape, and overlap with each other in a matching state when viewed from above.

The capacitor conductor layer 26 is a rectangular or substantially rectangular conductor layer provided on a left-half region of the top surface of the insulator layer 16i. The capacitor conductor layer 26 overlaps with the capacitor conductor layers 22a and 22b when viewed from above. With this configuration, the capacitor conductor layer 26 opposes the capacitor conductor layer 22a with the insulator layer 16h interposed therebetween, and opposes the capacitor conductor layer 22b with the insulator layer 16i interposed therebetween.

The via hole conductor v2 is connected to the capacitor conductor layers 22a and 22b and an upstream end of the inductor conductor layer 18a. Additionally, the via hole conductor v2 is connected to the outer electrode 14a with the capacitor conductor layers 20a and 20b and the via hole conductor v1 interposed therebetween. Accordingly, the capacitor conductor layers 22a and 22b and the upstream end of the inductor conductor layer 18a are electrically connected to the outer electrode 14a.

The connection conductor layer 34 is preferably a band-shaped conductor layer, for example, which is provided at the center or approximate center on the top surface of the insulator layer 16i, extending in the left-right direction. A left end of the connection conductor layer 34 is connected to the capacitor conductor layer 26. The connection conductor layer 35 is preferably a band-shaped conductor layer, for example, which is provided at the center or approximate center on the top surface of the insulator layer 16g, extending in the left-right direction. A left end of the connection conductor layer 35 is connected to a downstream end of the inductor conductor layer 18c. The via hole conductor v5 passes through the insulator layers 16g to 16j in the up-down direction. The via hole conductor v5 is connected to the connection conductor layers 34 and 35. Accordingly, the capacitor conductor layer 26 and the downstream end of the inductor conductor layer 18c are electrically connected to each other.

The capacitor C4 includes the ground conductor layer 30a and the capacitor conductor layer 32 (an example of an inner conductor layer). The ground conductor layer 30a is a rectangular or substantially rectangular conductor layer provided at the center or approximate center on the top surface of the insulator layer 16l. The capacitor conductor layer 32 is a rectangular or substantially rectangular conductor layer provided at the center or approximate center on the top surface of the insulator layer 16k. The capacitor conductor layer 32 overlaps with the ground conductor layer 30a when viewed from above. With this configuration, the capacitor conductor layer 32 opposes the ground conductor layer 30a with the insulator layer 16k interposed therebetween.

One electrode of the capacitor C4 (the capacitor conductor layer 32) and the other end of the inductor L1 (the downstream end of the inductor conductor layer 18c) are connected to each other with the connection conductor layer 35 and the via hole conductor v5 interposed therebetween. To be more specific, the via hole conductor v5 is connected to the capacitor conductor layer 32. Additionally, the via hole conductor v5 is connected to the downstream end of the inductor conductor layer 18c with the connection conductor layer 35 interposed therebetween. Accordingly, the capacitor conductor layer 32 and the downstream end of the inductor conductor layer 18c are electrically connected to each other.

The other electrode of the capacitor C4 (the ground conductor layer 30a) is connected to the outer electrode 14c with the via hole conductor v6 interposed therebetween.

When viewed from above, the inductor L1 and the capacitors C1 and C3 and the inductor L2 and the capacitors C2 and C5 preferably have a point symmetrical relationship with respect to a point at which diagonal lines of the upper surface of the multilayer body 12 intersect. The point symmetrical relationship means that, when being rotated by 180° around the point at which the diagonal lines of the upper surface of the multilayer body 12 intersect, the inductor L1 and the capacitors C1 and C3 match the inductor L2 and the capacitors C2 and C5. To be more specific, the inductor conductor layers 38a to 38c and the inductor conductor layers 18a to 18c are preferably in the point symmetrical relationship. The capacitor conductor layers 20a, 20b, 22a, 22b, and 26 and the ground conductor layer 24 and the capacitor conductor layers 40a, 40b, 42a, 42b, and 46 and the ground conductor layer 44 are in the point symmetrical relationship. The via hole conductors v1 to v4 and the via hole conductors v11 to v14 are in the point symmetrical relationship. Further detailed descriptions of the inductor L2 and the capacitors C2 and C5 will be omitted.

The capacitor C11 includes the inductor conductor layer 18a and the shield conductor layer 50. The capacitor C12 includes the inductor conductor layer 38a and the shield conductor layer 50. The shield conductor layer 50 is positioned farther upward (an example of the other side in the lamination direction) than the inductors L1 and L2 (that is, the inductor conductor layers 18a to 18c and 38a to 38c and the via hole conductors v3, v4, v13 and v14) and the capacitors C1 to C5 (that is, the capacitor conductor layers 20a, 20b, 22a, 22b, 26, 32, 40a, 40b, 42a, 42b, and 46 and the ground conductor layers 24, 30a, and 44). In the present preferred embodiment, the shield conductor layer 50 is provided on the top surface of the insulator layer 16b that is different from the insulator layers 16e to 16o on which the inductor conductor layers 18a to 18c and 38a to 38c, the capacitor conductor layers 20a, 20b, 22a, 22b, 26, 32, 40a, 40b, 42a, 42b, and 46, and the ground conductor layers 24, 30a, 30b, and 44 (an example of the inner conductor layer) are provided. The shield conductor layer 50 covers a portion of the top surface of the insulator layer 16b, and, in the present preferred embodiment, covers the entire or almost the entire surface of the top surface of the insulator layer 16b. With this configuration, when viewed from above, the shield conductor layer 50 overlaps with the inductor conductor layers 18a to 18c and 38a to 38c of the inductors L1 and L2. As a result, a left-half of the shield conductor layer 50 opposes the inductor conductor layer 18a with the insulator layers 16b to 16d interposed therebetween. Accordingly, the inductor conductor layer 18a is one electrode of the capacitor C11, and the shield conductor layer 50 is the other electrode of the capacitor C11. Additionally, a right-half of the shield conductor layer 50 opposes the inductor conductor layer 38a with the insulator layers 16b to 16d interposed therebetween. Accordingly, the inductor conductor layer 38a is one electrode of the capacitor C12, and the shield conductor layer 50 is the other electrode of the capacitor C12.

Note that, however, when viewed from above, the shield conductor layer 50 is not in contact with four sides of the insulator layer 16b. Accordingly, the shield conductor layer 50 is not physically connected to the shield electrode 13. Note that, the shield conductor layer 50 is preferably provided at a position within about 200 μm, for example, from the upper surface of the multilayer body 12, but may be provided at a position in a range of not less than about 300 μm and not more than about 400 μm, for example, from the upper surface of the multilayer body 12.

The inductor L11 includes the lead conductor layers 52a, 52b, 54a, 54b, 56a, 56b, 58a, and 58b (the lead conductor layers 52a, 54a, 56a, and 58a are examples of first lead conductor layers, and the lead conductor layers 52b, 54b, 56b, and 58b are examples of second lead conductor layers) and the via hole conductors v21 to v25, v31 to v35, v41 to v43, and v51 to v53 (the via hole conductors v21 to v23, v31 to v33, v41, v42, v51, and v52 are examples of first interlayer connection conductors, and the via hole conductors v23 to v25, v33 to v35, v42, v43, v52, and v53 are examples of second interlayer connection conductors). The lead conductor layers 52a, 54a, 56a, and 58a are provided on the top surface of the insulator layer 16c that is different from the insulator layer 16b on which the shield conductor layer 50 is provided, and are connected to the shield electrode 13. The lead conductor layers 52b, 54b, 56b, and 58b are provided on the top surface of the insulator layer 16d that is different from the insulator layer 16b on which the shield conductor layer 50 is provided and the insulator layer 16c on which the lead conductor layers 52a, 54a, 56a, and 58a are provided, and are connected to the shield electrode 13. With this configuration, the lead conductor layers 52a, 52b, 54a, 54b, 56a, 56b, 58a, and 58b are positioned farther downward (an example of the one side in the lamination direction) than the shield conductor layer 50.

Additionally, when viewed from above, the lead conductor layers 52a, 54a, 56a, and 58a are in contact with the center or approximate center of a short side on the left side, the center or approximate center of the short side on the right side, the center or approximate center of the long side on the front side, and the center or approximate center of the long side on the rear side of the insulator layer 16c, respectively, and are rectangular or substantially rectangular in shape. Additionally, when viewed from above, the lead conductor layers 52b, 54b, 56b, and 58b are in contact with the center or approximate center of a short side on the left side, the center or approximate center of the short side on the right side, the center or approximate center of the long side on the front side, and the center or approximate center of the long side on the rear side of the insulator layer 16d, respectively, and are rectangular or substantially rectangular in shape. The lead conductor layers 52a, 54a, 56a, and 58a preferably have the same or substantially the same shapes as the lead conductor layers 52b, 54b, 56b, and 58b, respectively. Note that, however, when viewed from above, the lead conductor layers 52a and 54a are slightly displaced toward the front side with respect to the lead conductor layers 52b and 54b, respectively. When viewed from above, the lead conductor layers 56a and 58a are slightly displaced toward the left side with respect to the lead conductor layers 56b and 58b, respectively.

The via hole conductors v21 and v22 pass through the insulator layer 16b in the up-down direction, and connect the shield conductor layer 50 and the lead conductor layer 58a. The via hole conductor v23 passes through the insulator layers 16b and 16c in the up-down direction, and connects the shield conductor layer 50 and the lead conductor layers 58a and 58b. The via hole conductors v24 and v25 pass through the insulator layers 16b and 16c in the up-down direction, and connect the shield conductor layer 50 and the lead conductor layer 58b.

The via hole conductors v31 and v32 pass through the insulator layer 16b in the up-down direction, and connect the shield conductor layer 50 and the lead conductor layer 56a. The via hole conductor v33 passes through the insulator layers 16b and 16c in the up-down direction, and connects the shield conductor layer 50 and the lead conductor layers 56a and 56b. The via hole conductors v34 and v35 pass through the insulator layers 16b and 16c in the up-down direction, and connect the shield conductor layer 50 and the lead conductor layer 56b.

The via hole conductor v41 passes through the insulator layer 16b in the up-down direction, and connects the shield conductor layer 50 and the lead conductor layer 52a. The via hole conductor v42 passes through the insulator layers 16b and 16c in the up-down direction, and connects the shield conductor layer 50 and the lead conductor layers 52a and 52b. The via hole conductor v43 passes through the insulator layers 16b and 16c in the up-down direction, and connects the shield conductor layer 50 and the lead conductor layer 52b.

The via hole conductor v51 passes through the insulator layer 16b in the up-down direction, and connects the shield conductor layer 50 and the lead conductor layer 54a. The via hole conductor v52 passes through the insulator layers 16b and 16c in the up-down direction, and connects the shield conductor layer 50 and the lead conductor layers 54a and 54b. The via hole conductor v53 passes through the insulator layers 16b and 16c in the up-down direction, and connects the shield conductor layer 50 and the lead conductor layer 54b.

One end of the inductor L11 (upper ends of the via hole conductors v21 to v25, v31 to v35, v41 to v43, and v51 to v53) is connected to the other electrodes of the capacitors C11 and C12 (the shield conductor layer 50). Additionally, the other end of the inductor L11 (the lead conductor layers 52a, 52b, 54a, 54b, 56a, 56b, 58a, and 58b) is connected to the shield electrode 13.

The direction identification mark 60 is a circular or substantially circular conductor layer provided on the upper surface of the multilayer body 12 (the top surface of the insulator layer 16a). The direction identification mark 60 is used when a direction of the electronic component 10a is identified.

The inductor conductor layers 18a to 18c and 38a to 38c, the capacitor conductor layers 20a, 20b, 22a, 22b, 26, 32, 40a, 40b, 42a, 42b, and 46, the connection conductor layers 34 and 35, the ground conductor layers 24, 30a, 30b, and 44, the shield conductor layer 50, the lead conductor layers 52a, 52b, 54a, 54b, 56a, 56b, 58a, and 58b, the direction identification mark 60, and the via hole conductors v1 to v6, v11 to v14, v21 to v25, v31 to v35, v41 to v43, and v51 to v53 are preferably made of a conductive material, such as Cu, for example.

In the electronic component 10a according to the present preferred embodiment, as described below, a frequency or an attenuation of an attenuation pole is able to be adjusted. To be more specific, in the multilayer LC composite component disclosed in Japanese Unexamined Patent Application Publication No. 2002-76807, a ground pattern is directly connected to an outer electrode which is connected to a ground. The ground pattern is a conductor layer provided on an insulator layer, and therefore, only have a small inductance component. Accordingly, almost no inductor is provided between the ground pattern and the outer electrode connected to the ground potential, and almost no LC serial resonator is provided. Accordingly, in the multilayer LC composite component disclosed in Japanese Unexamined Patent Application Publication No. 2002-76807, the attenuation pole by LC serial resonator has only a small attenuation. In order to adjust the frequency or the attenuation of the attenuation pole as described above, a passive circuit element may be provided, which leads to an increase in size of the component.

On the other hand, in the electronic component 10a, when viewed from above, the shield conductor layer 50 overlaps with the inductor conductor layers 18a and 38a. With this configuration, the capacitor C11 is provided between the inductor conductor layer 18a and the shield conductor layer 50, and the capacitor C12 is provided between the inductor conductor layer 38a and the shield conductor layer 50. Additionally, the shield conductor layer 50 is connected to the shield electrode 13 with the lead conductor layers 52a, 52b, 54a, 54b, 56a, 56b, 58a, and 58b and the via hole conductors v21 to v25, v31 to v35, v41 to v43, and v51 to v53 interposed therebetween. The via hole conductors v21 to v25, v31 to v35, v41 to v43, and v51 to v53 have a relatively large inductance component, and therefore, define the inductor L11. As a result, the LC serial resonator LC11 in which the inductor L11 and the capacitors C11 and C12 are connected in series is provided. The LC serial resonator LC11 is, as illustrated in FIG. 1A and FIG. 2A, connected to the outer electrode 14c, which is connected to the ground potential, with the shield electrode 13, the ground conductor layers 30a and 30b, and the via hole conductor v6 interposed therebetween. Accordingly, a high-frequency signal with a resonant frequency of the LC serial resonator LC11 among high-frequency signals transmitted between the outer electrodes 14a and 14b flows to the outer electrode 14c. As a result, in a bandpass characteristic of the electronic component 10a, an attenuation pole having a sufficient attenuation is provided at a position of the resonant frequency of the LC serial resonator LC11. In other words, in the electronic component 10a, the frequency and the attenuation of the attenuation pole are able to be adjusted.

Furthermore, in the electronic component 10a, since a passive circuit element is not provided in order to adjust the frequency or the attenuation of the attenuation pole, miniaturization in the component size is able to be achieved.

Additionally, in the electronic component 10a, the frequency of the attenuation pole is able to be easily adjusted. Hereinafter, as an electronic component according to a comparative example, an electronic component in which the lead conductor layers 52a, 52b, 54a, 54b, 56a, 56b, 58a, and 58b and the via hole conductors v21 to v25, v31 to v35, v41 to v43, and v51 to v53 are not provided and a shield conductor layer 50' corresponding to the shield conductor layer 50 is connected to the shield electrode 13 in the electronic component 10a is described as an example. Note that, in the electronic component according to the comparative example, the same or substantially the same configuration as that of the electronic component 10a will be described using the same reference signs.

In the electronic component according to the comparative example, the via hole conductors v21 to v25, v31 to v35, v41 to v43, and v51 to v53 are not provided. Accordingly, the inductor corresponding to the inductor L11 is provided by an inductor component of the shield conductor layer 50'. Accordingly, an inductance value of the inductor corresponding to the inductor L11 is small. In order to increase the inductance value as described above and adjust the inductance value, it is necessary to largely change a shape of the shield conductor layer 50'.

However, the shield conductor layer 50' needs to function as a shield conductor layer of the multilayer body 12. Accordingly, it is difficult to largely change the shape of the shield conductor layer 50'. Accordingly, in the electronic component according to the comparative example, it is difficult to increase the inductance value of the inductor corresponding to the inductor L11 and to adjust the inductance value. As a result, in the electronic component according to the comparative example, it is difficult to provide the attenuation pole having the sufficient attenuation and to adjust the frequency of the attenuation pole.

On the other hand, in the electronic component 10a, by adjusting lengths, the number, or thicknesses of the via hole conductors v21 to v25, v31 to v35, v41 to v43, and v51 to v53, the frequency of the attenuation pole is able to be adjusted. Changes of the lengths, the number, or the thicknesses of the via hole conductors v21 to v25, v31 to v35, v41 to v43, and v51 to v53 is easier than the change of the shield conductor layer 50'. Accordingly, in the electronic component 10a, the frequency of the attenuation pole is able to be easily adjusted.

To be more specific, in the electronic component 10a, the via hole conductors v21 to v25, v31 to v35, v41 to v43, and v51 to v53 define and function as the inductor L11. Accordingly, by adjusting the lengths of the via hole conductors v21 to v25, v31 to v35, v41 to v43, and v51 to v53, the inductance value of the inductor L11 is able to be adjusted. Specifically, if the lengths of the via hole conductors v21 to v25, v31 to v35, v41 to v43, and v51 to v53 are increased, the inductance value of the inductor L11 increases, and the resonant frequency of the LC serial resonator LC11 decreases. If the lengths of the via hole conductors v21 to v25, v31 to v35, v41 to v43, and v51 to v53 are decreased, the inductance value of the inductor L11 decreases, and the resonant frequency of the LC serial resonator LC11 increases. As described above, by adjusting the lengths of the via hole conductors v21 to v25, v31 to v35, v41 to v43, and v51 to v53, the frequency of the attenuation pole is able to be adjusted.

Furthermore, if the number of the via hole conductors v21 to v25, v31 to v35, v41 to v43, and v51 to v53 decreases, the inductance value of the inductor L11 increases, and the resonant frequency of the LC serial resonator LC11 decreases. If the number of the via hole conductors v21 to v25, v31 to v35, v41 to v43, and v51 to v53 increases, the inductance value of the inductor L11 decreases, and the resonant frequency of the LC serial resonator LC11 increases. As described above, by adjusting the number of the via hole conductors v21 to v25, v31 to v35, v41 to v43, and v51 to v53, the frequency of the attenuation pole is able to be adjusted.

Furthermore, if the thicknesses of the via hole conductors v21 to v25, v31 to v35, v41 to v43, and v51 to v53 decrease, the inductance value of the inductor L11 increases, and the resonant frequency of the LC serial resonator LC11 decreases. If the thicknesses of the via hole conductors v21 to v25, v31 to v35, v41 to v43, and v51 to v53 increase, the inductance value of the inductor L11 decreases, and the resonant frequency of the LC serial resonator LC11 increases. As described above, by adjusting the thicknesses of the via hole conductors v21 to v25, v31 to v35, v41 to v43, and v51 to v53, the frequency of the attenuation pole is able to be adjusted.

Additionally, in the electronic component 10a, the shield electrode 13 and the lead conductor layers 52a, 52b, 54a, 54b, 56a, 56b, 58a, and 58b are more reliably connected. To be more specific, the shield electrode 13 covers the entire or almost the entire surfaces of the four side surfaces of the multilayer body 12. Note that, however, it is difficult to structure the shield electrode 13 so as to cover the entire surfaces of the four side surfaces. Accordingly, for example, there is a region in which the shield electrode 13 is not provided in the vicinity of the upper surface in the four side surfaces of the multilayer body 12. Additionally, in a case in which the lead conductor layers 52a, 52b, 54a, 54b, 56a, 56b, 58a, and 58b are exposed from the four side surfaces in this region, the shield electrode 13 and the lead conductor layers 52a, 52b, 54a, 54b, 56a, 56b, 58a, and 58b are not connected.

Accordingly, in the electronic component 10a, the lead conductor layers 52a, 52b, 54a, 54b, 56a, 56b, 58a, and 58b are positioned on a lower side than the shield conductor layer 50. With this configuration, the lead conductor layers 52a, 52b, 54a, 54b, 56a, 56b, 58a, and 58b are distanced from the upper surface of the multilayer body 12, and are therefore, unlikely to be exposed from the region in which the shield electrode 13 is not provided in the four side surfaces of the multilayer body 12. As a result, in the electronic component 10a, the shield electrode 13 and the lead conductor layers 52a, 52b, 54a, 54b, 56a, 56b, 58a, and 58b are more reliably connected.

Additionally, in the electronic component 10a, occurrence of interlayer separation in the multilayer body 12 is reduced or prevented. Hereinafter, an electronic component according to a first preferred embodiment of the present invention (not illustrated) will be described as an example. The electronic component according to the first preferred embodiment includes the lead conductor layers 52', 54', 56', and 58' (not illustrated) instead of the lead conductor layers 52a, 52b, 54a, 54b, 56a, 56b, 58a, and 58b. The lead conductor layers 52', 54', 56', and 58' are provided on the top surface of the insulator layer 16c. The lead conductor layer 52' has a rectangular or substantially rectangular shape defined by the lead conductor layers 52a and 52b overlapping with each other when viewed from above. The lead conductor layer 54' has a rectangular or substantially rectangular shape defined by the lead conductor layers 54a and 54b overlapping with each other when viewed from above. The lead conductor layer 56' has a rectangular or substantially rectangular shape defined by the lead conductor layers 56a and 56b overlapping with each other when viewed from above. The lead conductor layer 58' has a rectangular or substantially rectangular shape defined by the lead conductor layers 58a and 58b overlapping with each other when viewed from above. Note that, in the electronic component according to the first preferred embodiment, the same configuration as that of the electronic component 10a will be described using the same reference signs.

In order to reduce or prevent the occurrence of the interlayer separation in the multilayer body, it is necessary for two adjacent insulator layers to be in close contact with each other. Close contact force between the two adjacent insulator layers depends on a contact area of the two adjacent insulator layers. Accordingly, an area of the conductor layer between the two adjacent insulator layers is preferably small.

In the electronic component according to the first preferred embodiment, the insulator layer 16b and the insulator layer 16c cannot make contact with each other in a region in which the lead conductor layers 52', 54', 56', and 58' are provided. On the other hand, in the electronic component 10a, the insulator layer 16b and the insulator layer 16c cannot make contact with each other in a region in which the lead conductor layers 52a, 54a, 56a, and 58a are provided. Furthermore, in the electronic component 10a, the insulator layer 16c and the insulator layer 16d cannot make contact with each other in a region in which the lead conductor layers 52b, 54b, 56b, and 58b are provided.

The lead conductor layer 52' has the rectangular or substantially rectangular shape defined by the lead conductor layers 52a and 52b overlapping with each other when viewed from above, and therefore, has a larger area than that of each of the lead conductor layers 52a and 52b. The lead conductor layer 54' has the rectangular or substantially rectangular shape defined by the lead conductor layers 54a and 54b overlapping with each other when viewed from above, and therefore, has a larger area than that of each of the lead conductor layers 54a and 54b. The lead conductor layer 56' has the rectangular or substantially rectangular shape defined by the lead conductor layers 56a and 56b overlapping with each other when viewed from above, and therefore, has a larger area than that of each of the lead conductor layers 56a and 56b. The lead conductor layer 58' has the rectangular or substantially rectangular shape defined by the lead conductor layers 58a and 58b overlapping with each other when viewed from above, and therefore, has a larger area than that of each of the lead conductor layers 58a and 58b. Accordingly, the area of the region in which the lead conductor layers 52a, 54a, 56a, and 58a are provided and the area of the region in which the lead conductor layers 52b, 54b, 56b, and 58b are provided are each smaller than the area of the region in which the lead conductor layers 52', 54', 56', and 58' are provided. As a result, the contact area between the insulator layer 16b and the insulator layer 16c and the contact area between the insulator layer 16c and the insulator layer 16d in the electronic component 10a each become larger than the contact area between the insulator layer 16b and the insulator layer 16c in the electronic component according to the comparative example. According to the above description, in the electronic component 10a, the occurrence of the interlayer separation between the insulator layer 16b and the insulator layer 16c and between the insulator layer 16c and the insulator layer 16d is able to be reduced or prevented.

Additionally, the electronic component 10a may be mounted on a circuit substrate in a state in which the electronic component 10a is close to other electronic components. In the electronic component 10a, the shield electrode 13 is not physically connected to any of the outer electrodes 14a to 14c on the surface of the multilayer body 12. Accordingly, on the bottom surface of the multilayer body 12, there is a gap between the shield electrode 13 and each of the outer electrodes 14a to 14c. As a result, in a case in which the electronic component 10a is mounted on the circuit substrate using solder, the solder applied to the outer electrodes 14a to 14c is reduced or prevented from adhering to the shield electrode 13. In other words, the solder is reduced or prevented from wetting up on the side surfaces of the multilayer body 12. With this configuration, even if the other electronic components are close to the electronic component 10a, the solder is reduced or prevented from making contact with the other electronic components. As a result, the electronic component 10a is able to be mounted on the circuit substrate in a state of being close to the other electronic components.

Additionally, according to the electronic component 10a, a high shield effect is obtained, and thus, noise is reduced or prevented from entering from the exterior and noise is reduced or prevented from being radiated to the exterior. To be more specific, in the electronic component 10a, the shield electrode 13 covers the entire or almost the entire surfaces of the four side surfaces of the multilayer body 12. This reduces or prevents the noise from entering the electronic component 10a from the side surfaces of the electronic component 10a, and reduces or prevents the noise from being radiated outside the electronic component 10a from the side surfaces of the electronic component 10a. Furthermore, in the electronic component 10a, the shield conductor layer 50 is provided closer to the upper surface of the multilayer body 12 than the inductors L1 and L2 and the capacitors C1 to C5. The shield conductor layer 50 overlaps with the entire or almost the entire upper surface of the multilayer body 12 when viewed from above. This reduces or prevents the noise from entering the inductors L1 and L2 and the capacitors C1 to C5 from the upper surface of the electronic component 10a, and reduces or prevents the noise from being radiated to the inductors L1 and L2 and the capacitors C1 to C5 from the upper surface of the electronic component 10a.

Additionally, in the electronic component 10a, when the electronic component 10a is mounted on the circuit substrate, occurrence of suction errors of the electronic component 10a is able to be reduced or prevented. To be more specific, a surface roughness of the shield electrode 13 is larger than a surface roughness of the multilayer body 12. As a result, if the shield electrode 13 is sucked, there is a risk that suction errors of the electronic component 10a occur. Accordingly, in the electronic component 10a, the shield electrode 13 is not provided on the upper surface of the multilayer body 12. This makes it possible to suck the upper surface of the multilayer body 12, and the occurrence of the suction errors of the electronic component 10a is reduced or prevented.

Additionally, in the electronic component 10a, the shield electrode 13 is not provided on the upper surface of the multilayer body 12, and thus, the direction identification mark 60 is able to be provided on the upper surface of the multilayer body 12. This makes it possible to easily identify the direction of the electronic component 10a.

Additionally, in the electronic component 10a, the shield electrode 13 is not provided on the upper surface of the multilayer body 12. Accordingly, in the electronic component 10a, as compared to the electronic component in which the upper surface of the multilayer body 12 is covered by the shield electrode 13, a shrinkage amount in the vicinity of the upper surface of the multilayer body 12 and a shrinkage amount in the vicinity of the bottom surface of the multilayer body 12 during firing are closer to each other. As a result, after firing, occurrence of warpage of the electronic component 10a is reduced or prevented.

Figure 2B:
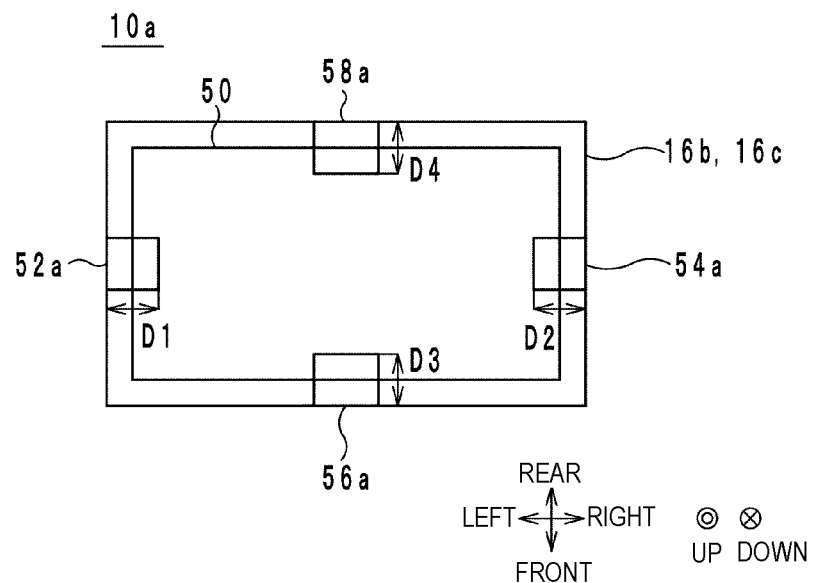
FIG. 2B is a diagram of lead conductor layers 52a, 54a, 56a, and 58a and a shield conductor layer 50 of an electronic component 10a according to a preferred embodiment of the present invention when viewed from above.
Figure 2C:
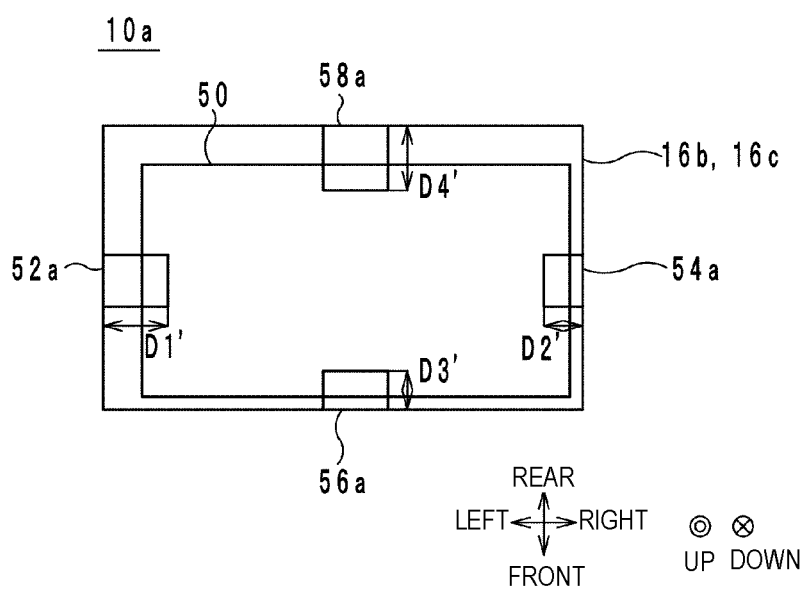
FIG. 2C is a diagram of the lead conductor layers 52a, 54a, 56a, and 58a and the shield conductor layer 50 of an electronic component 10a according to a preferred embodiment of the present invention when viewed from above.
Figure 2D:
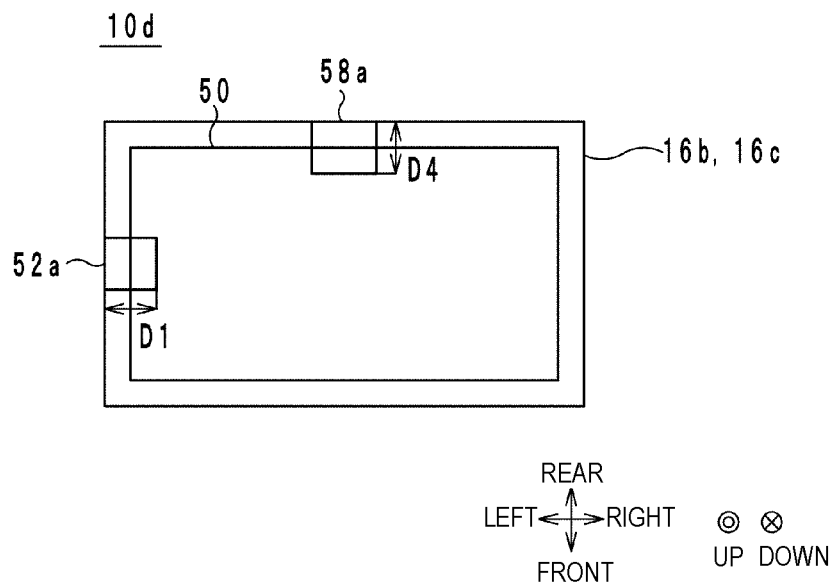
FIG. 2D is a diagram of the lead conductor layers 52a and 58a and the shield conductor layer 50 of an electronic component 10d according to a reference example when viewed from above.
Figure 2E:
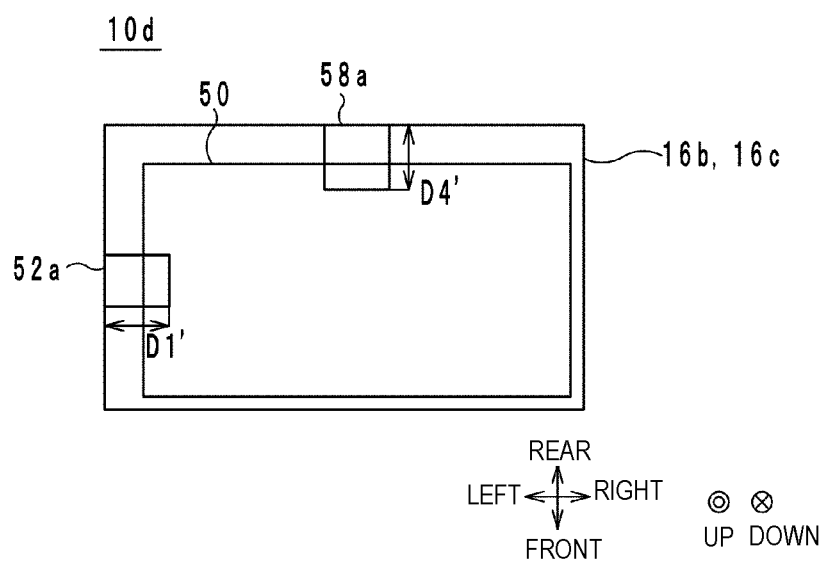
FIG. 2E is a diagram of the lead conductor layers 52a and 58a and the shield conductor layer 50 of the electronic component 10d according to the reference example when viewed from above.

Additionally, in the electronic component 10a, variation in the inductance value of the inductor L11 is reduced or prevented. FIGS. 2B and 2C are diagrams of the lead conductor layers 52a, 54a, 56a, and 58a and the shield conductor layer 50 of the electronic component 10a when viewed from above. FIGS. 2D and 2E are diagrams of the lead conductor layers 52a and 58a and the shield conductor layer 50 of an electronic component 10d according to a reference example when viewed from above. In FIGS. 2B and 2D, when the multilayer body 12 is cut from a block state and divided into an individual chip shape, no cut displacement occurs. In FIGS. 2C and 2E, the cut displacement of the multilayer body 12 occurs. To be more specific, in FIG. 2C and FIG. 2E, a cut position is displaced to the rear side and the left side from the original position.

In the electronic component 10d according to the reference example, as illustrated in FIGS. 2D and 2E, the lead conductor layers 52a and 58a are provided on the insulator layer 16c. Additionally, the number of the lead conductor layers 52a being in contact with the short side of the insulator layer 16c on the left side and the number of the lead conductor layers being in contact with the short side of the insulator layer 16c on the right side are different from each other. In other words, there is no lead conductor layer in contact with the short side of the insulator layer 16c on the right side. Additionally, the number of the lead conductor layers in contact with the long side of the insulator layer 16c on the front side and the number of the lead conductor layers 58a in contact with the long side of the insulator layer 16c on the rear side are different from each other. In other words, there is no lead conductor layer in contact with the long side of the insulator layer 16c on the front side.

Here, in FIG. 2D, a length of the lead conductor layer 52a in the left-right direction is taken as a length D1. Additionally, in FIG. 2D, a length of the lead conductor layer 58a in the front-rear direction is taken as a length D4. When the cut displacement occurs in the electronic component 10d, as illustrated in FIG. 2E, the length of the lead conductor layer 52a in the left-right direction increases from the length D1 to a length D1'. Additionally, when the cut displacement occurs in the electronic component 10d, as illustrated in FIG. 2E, the length of the lead conductor layer 58a in the front-rear direction increases from the length D4 to a length D4'. Accordingly, an inductance component generated in the lead conductor layers 52a and 58a in FIG. 2E becomes larger than an inductance component generated in the lead conductor layers 52a and 58a in FIG. 2D. In other words, the inductance value of the inductor L11 of the electronic component 10d in FIG. 2E becomes larger than the inductance value of the inductor L11 of the electronic component 10d in FIG. 2D. As described above, in the electronic component 10d, the variation in the inductance value of the inductor L11 occurs due to the cut displacement.

Accordingly, in the electronic component 10a, as illustrated in FIGS. 2A and 2B, the lead conductor layers 52a, 54a, 56a, and 58a (an example of a plurality of first lead conductor layers) are provided on the insulator layer 16c (an example of one predetermined insulator layer). Additionally, the number of the lead conductor layers 52a in contact with the short side of the insulator layer 16c on the left side (an example of a first side) is one, which is equal to the number of the lead conductor layers 54a in contact with the short side of the insulator layer 16c on the right side (an example of a second side). Additionally, the number of the lead conductor layers 56a in contact with the long side of the insulator layer 16c on the front side (an example of a third side) is one, which is equal to the number of the lead conductor layers 58a in contact with the long side of the insulator layer 16c on the rear side (an example of a fourth side).

In FIG. 2B, lengths of the lead conductor layers 52a and 54a in the left-right direction are taken as lengths D1 and D2, respectively. Additionally, in FIG. 2B, lengths of the lead conductor layers 56a and 58a in the front-rear direction are taken as lengths D3 and D4, respectively. In the electronic component 10a in which no cut displacement occurs, D1 and D2 are equal or substantially equal to each other, and D3 and D4 are equal or substantially equal to each other.

When the cut displacement occurs in the electronic component 10a as described above, as illustrated in FIG. 2C, the length of the lead conductor layer 52a in the left-right direction increases from the length D1 to the length D1', and the length of the lead conductor layer 54a in the left-right direction decreases from the length D2 to a length D2'. Additionally, when the cut displacement occurs in the electronic component 10a, as illustrated in FIG. 2C, the length of the lead conductor layer 56a in the front-rear direction decreases from the length D3 to a length D3', and the length of the lead conductor layer 58a in the front-rear direction increases from the length D4 to the length D4'. Accordingly, an increment of the length of the lead conductor layer 52a in the left-right direction and a decrement of the length of the lead conductor layer 54a in the left-right direction are canceled out. Additionally, a decrement of the length of the lead conductor layer 56a in the front-rear direction and an increment of the length of the lead conductor layer 58a in the front-rear direction are canceled out. As a result, regardless of the presence or absence of the cut displacement, the total sum of the lengths of the lead conductor layers 52a, 54a, 56a, and 58a is constant or substantially constant. For the same reason, regardless of the presence or absence of the cut displacement, the total sum of the lengths of the lead conductor layers 52b, 54b, 56b, and 58b is constant or substantially constant. As a result, in the electronic component 10a, variation in the inductance value of the inductor L11 is reduced or prevented. Note that, the electronic component 10*d* according to the reference example is a preferred embodiment of the electronic component according to the present invention, and is not intended to be excluded from the present invention. Additionally, the variation of the inductance value of the inductor L11 occurs not only by the cut displacement, for example, but also by lamination displacement of the insulator layers 16*a* to 16*p*. According to the electronic component 10*a*, the variation of the inductance value of the inductor L11 that occurs by the lamination displacement of the insulator layers 16*a* to 16*p* is also able to be reduced or prevented.

Figure 3A:
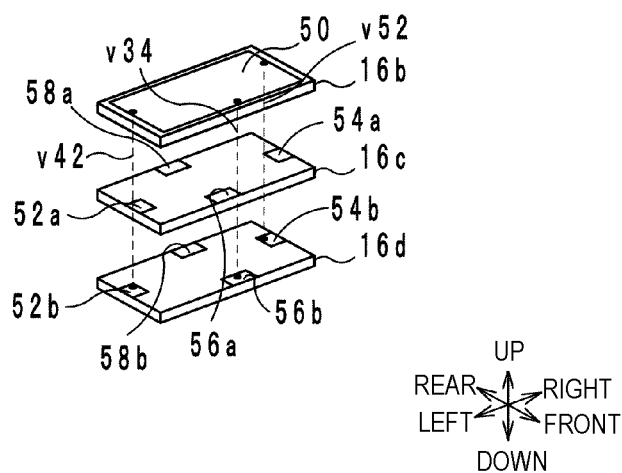
FIG. 3A is an exploded perspective view of insulator layers 16b to 16d of an electronic component according to a third preferred embodiment of the present invention.
Figure 3B:
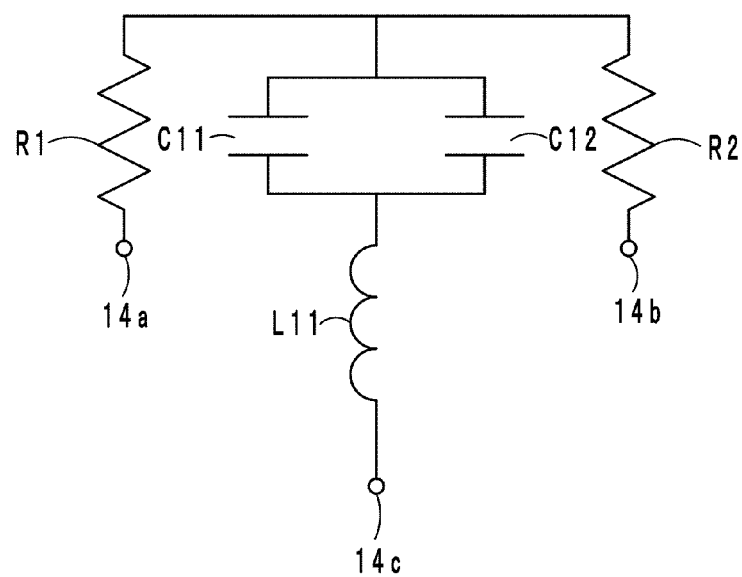
FIG. 3B is an equivalent circuit diagram of an electronic component according to a second preferred embodiment and the electronic component according to the third preferred embodiment of the present invention.

Incidentally, the inventors of preferred embodiments of the present invention performed a computer simulation described below to further clarify the advantageous effects provided by the electronic component 10*a*. FIG. 3A is an exploded perspective view of the insulator layers 16*b* to 16*d* of an electronic component according to a third preferred embodiment of the present invention. FIG. 3B is an equivalent circuit diagram of an electronic component according to a second preferred embodiment of the present invention and the electronic component according to the third preferred embodiment.

The inventors of preferred embodiments of the present invention created a first model having a structure of the electronic component according to the second preferred embodiment, and a second model having a structure of the electronic component according to the third preferred embodiment. The number of the via hole conductors is different between the electronic component according to the second preferred embodiment and the electronic component according to the third preferred embodiment. To be more specific, the electronic component according to the second preferred embodiment includes the shield conductor layer 50, the lead conductor layers 52*a*, 52*b*, 54*a*, 54*b*, 56*a*, 56*b*, 58*a*, and 58*b*, and the via hole conductors v21 to v25, v31 to v35, v41 to v43, and v51 to v53 in FIG. 2A. Additionally, although detailed descriptions are omitted, a structure of the electronic component according to the second preferred embodiment on the side lower than the insulator layer 16*e* is a structure in which resistors R1 and R2 are defined by the via hole conductor and the conductor layer, instead of a structure in FIG. 2A. The resistors R1 and R2 are connected in series between the outer electrode 14*a* and the outer electrode 14*b*. The electronic component according to the third preferred embodiment includes the shield conductor layer 50, the lead conductor layers 52*a*, 52*b*, 54*a*, 54*b*, 56*a*, 56*b*, 58*a*, and 58*b*, and the via hole conductors v34, v42, and v52 in FIG. 3A. Additionally, a structure of the electronic component according to the third preferred embodiment on the side lower than the insulator layer 16*e* is the same or substantially the same as that of the electronic component according to the second preferred embodiment, and is a structure in which the resistors R1 and R2 are defined by the via hole conductor and the conductor layer. The resistors R1 and R2 are connected in series between the outer electrode 14*a* and the outer electrode 14*b*.

Figure 4:
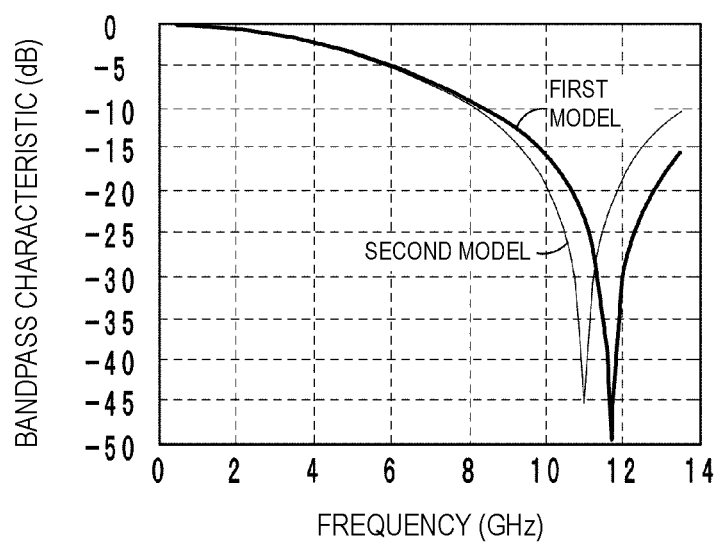
FIG. 4 is a graph illustrating bandpass characteristics of a first model and a second model.

FIG. 4 is a graph illustrating bandpass characteristics of the first model and the second model. The bandpass characteristic is a value of a ratio of strength of a signal output from the outer electrode 14*b* to strength of a signal input from the outer electrode 14*a*. In FIG. 4, a vertical axis represents the bandpass characteristic, and a horizontal axis represents a frequency.

The number of the via hole conductors of the first model is larger than the number of the via hole conductors of the second model. Accordingly, the inductance value of the inductor L11 of the first model is smaller than the inductance value of the inductor L11 of the second model. Accordingly, the resonant frequency of the LC serial resonator LC11 of the first model is higher than the resonant frequency of the LC serial resonator LC11 of the second model. As a result, as illustrated in FIG. 4, it is seen that the frequency of the attenuation pole of the first model is higher than the frequency of the attenuation pole of the second model. The above-described computer simulation shows that the frequency of the attenuation pole is able to be adjusted by adjusting the number of the via hole conductors.

Figure 5:
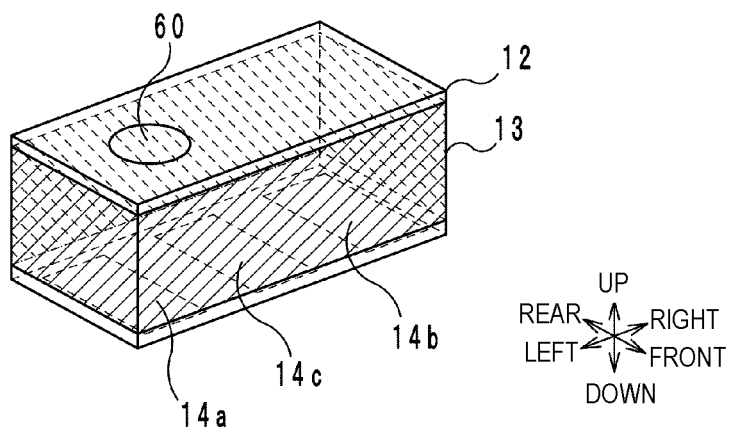
FIG. 5 is an outer appearance perspective view of an electronic component 10b according to a preferred embodiment of the present invention.

Hereinafter, the configuration of an electronic component according to a first variation of a preferred embodiment of the present invention will be described with reference to the drawings. FIG. 5 is an outer appearance perspective view of an electronic component 10*b*. An equivalent circuit diagram and an exploded perspective view of the electronic component 10*b* are the same or substantially the same as those of the electronic component 10*a*, and therefore, FIG. 1A and FIG. 2A are used as these drawings.

The electronic component 10*b* is different from the electronic component 10*a* in a shape of the shield electrode 13. Hereinafter, the electronic component 10*b* will be described while focusing on this difference.

As illustrated in FIG. 5, in the electronic component 10*b*, the shield electrode 13 is not in contact with the upper surface and the bottom surface of the multilayer body 12. In other words, there is a gap in which no conductor is provided between the shield electrode 13 and the upper surface of the multilayer body 12, and there is a gap in which no conductor is provided between the shield electrode 13 and the bottom surface of the multilayer body 12.

The electronic component 10*b* as described above provides the same or substantially the same advantageous effects as those provided by the electronic component 10*a*.

Additionally, in the electronic component 10*b*, the shield electrode 13 is prevented from being provided on the upper surface of the multilayer body 12 during manufacturing. This reduces or prevents uneven portions from being formed on the upper surface of the multilayer body 12, and reduces or prevents the suction errors of the electronic component 10*b* from occurring.

Additionally, in the electronic component 10*b*, the shield electrode 13 is prevented from being provided on the bottom surface of the multilayer body 12 in manufacturing. As a result, the shield electrode 13 and the outer electrodes 14*a* to 14*c* are reduced or prevented from being short-circuited to each other.

Note that, the shield electrode 13 may not make contact with any one of the upper surface and the bottom surface of the multilayer body 12.

Figure 6:
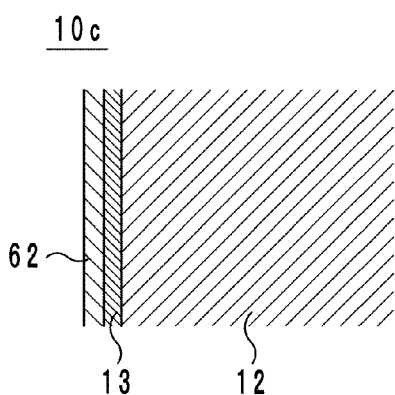
FIG. 6 is a cross-sectional structural diagram of an electronic component 10c according to a preferred embodiment of the present invention.

Hereinafter, the configuration of an electronic component according to a second variation will be described with reference to the drawings. FIG. 6 is a cross-sectional structural diagram of an electronic component 10*c*. An equivalent circuit diagram and an exploded perspective view of the electronic component 10*c* are the same or substantially the same as the equivalent circuit diagram and the exploded perspective view of the electronic component 10*a* respectively, and therefore FIG. 1A and FIG. 2A are used.

The electronic component 10*c* is different from the electronic component 10*a* in that a resin layer 62 is further included. As illustrated in FIG. 6, the resin layer 62 covers the surface of the shield electrode 13.

In the electronic component 10*c* as described above, the solder is reduced or prevented from wetting up on the shield electrode 13. To be more specific, in a case in which the shield electrode 13 is formed by applying a conductive paste, when the outer electrodes 14a to 14c are plated with Ni and Sn, the surface of the shield electrode 13 is also plated with Ni and Sn. The Ni plating and the Sn plating have excellent solder wettability, and therefore, solder wettability of the shield electrode 13 is also improved. In other words, there is a risk that the solder wets up on the side surfaces of the electronic component 10c.

Accordingly, in the electronic component 10c, the resin layer 62 covers the surface of the shield electrode 13. Solder wettability of the resin layer 62 is lower than the solder wettability of the Ni plating and the Sn plating. Accordingly, the solder is reduced or prevented from wetting up on the resin layer 62 (that is, the side surfaces of the electronic component 10c).

Figure 7:
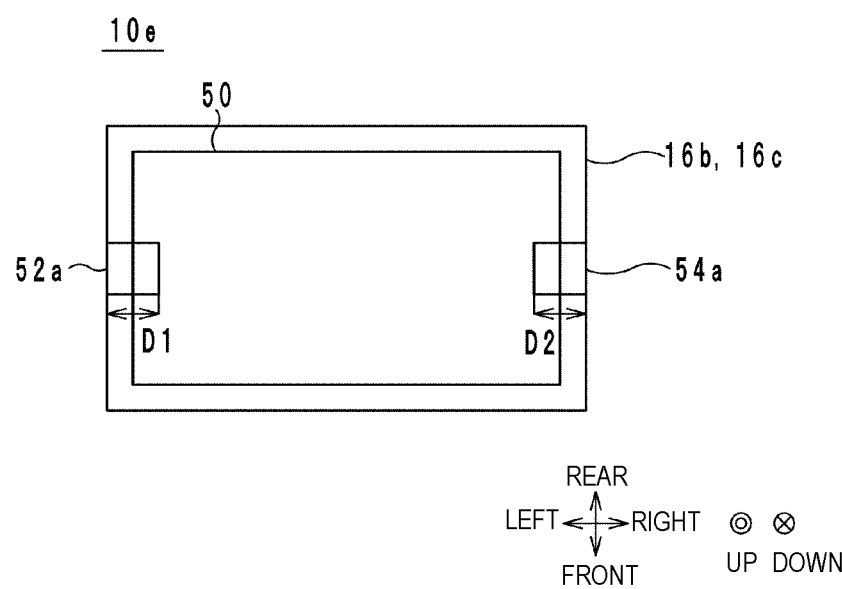
FIG. 7 is a diagram of the shield conductor layer 50 and the lead conductor layers 52a and 54a of an electronic component 10e according to a preferred embodiment of the present invention when viewed from above.

Hereinafter, the configuration of an electronic component according to a third variation will be described with reference to the drawings. FIG. 7 is a diagram of the shield conductor layer 50 and the lead conductor layers 52a and 54a of an electronic component 10e when viewed from above.

The electronic component 10e is different from the electronic component 10a in that the lead conductor layers 56a, 56b, 58a, and 58b are not included. In other words, the number of the lead conductor layers 52a in contact with the short side of the insulator layer 16c on the left side is one, which is equal to the number of the lead conductor layers 54a in contact with the short side of the insulator layer 16c on the right side. Additionally, no lead conductor layer makes contact with the long side on the front side and the long side on the rear side of the insulator layer 16c. Although not illustrated in the drawings, the number of the lead conductor layers 52b in contact with the short side of the insulator layer 16d on the left side is one, which is equal to the number of the lead conductor layers 54b in contact with the short side of the insulator layer 16d on the right side. Additionally, no lead conductor layer makes contact with the long side on the front side and the long side on the rear side of the insulator layer 16d. In the above-described electronic component 10e as well, for the same or substantially the same reason as in the electronic component 10a, variation in the inductance value of the inductor L11 is reduced or prevented from occurring.

Note that, the electronic component 10e may include the lead conductor layers 56a, 56b, 58a, and 58b, instead of the lead conductor layers 52a, 52b, 54a, and 54b.

The electronic components according to preferred embodiments of the present invention are not limited to the electronic components 10a to 10e, and may be modified without departing from the essential spirit thereof.

Note that, the configurations of the electronic components 10a to 10e may be combined as desired.

Additionally, the electronic components 10a to 10e include a low pass filter as an example, but may include other circuits or passive elements. A circuit included in the electronic components 10a to 10e is preferably a circuit defined by a combination of passive elements, for example. Accordingly, the electronic components 10a to 10e do not include an active element. As a passive element included in the electronic components 10a to 10e, for example, a coil, an inductor, a resistor, or other suitable passive elements may preferably be provided. Additionally, as a circuit included in the electronic components 10a to 10e, for example, a diplexer, a coupler, a low pass filter, a band pass filter, or other suitable circuit may preferably be provided.

Additionally, the electronic components 10a to 10e are chip components, and are not module components. The chip component refers to a small electronic component in which a circuit defined by a passive element or a combination of passive elements is configured by a combination of a conductor layer, a via hole conductor, or other circuit elements. Accordingly, a module component in which the active element, such as a semiconductor integrated circuit or other suitable active element is mounted on a circuit substrate and the semiconductor integrated circuit is sealed by a resin is not included in a chip component of the present application.

Additionally, in the electronic components 10a to 10e, the shield electrode 13 is provided on the side surfaces of the multilayer body 12. However, on the side surfaces of the multilayer body 12, an outer electrode connected to the ground potential may be provided, instead of the shield electrode 13. In other words, the outer electrodes 14c may be provided on the bottom surface and the side surfaces of the multilayer body 12, and the lead conductor layers 52a, 52b, 54a, 54b, 56a, 56b, 58a, and 58b may be connected to the outer electrode 14c.

Additionally, in the electronic components 10a to 10e, the lead conductor layers 52a, 52b, 54a, 54b, 56a, 56b, 58a, and 58b may be positioned on the upper side from the shield conductor layer 50.

Additionally, in the electronic components 10a to 10e, the number of the lead conductor layers in contact with the short side of the insulator layer 16c on the left side and the number of the lead conductor layers in contact with the short side of the insulator layer 16c on the right side may be two or more, for example. Furthermore, in the electronic components 10a to 10e, the number of the lead conductor layers in contact with the short side of the insulator layer 16d on the left side and the number of the lead conductor layers in contact with the short side of the insulator layer 16d on the right side may be two or more, for example. Additionally, in the electronic components 10a to 10c, the number of the lead conductor layers in contact with the long side of the insulator layer 16c on the front side and the number of the lead conductor layers in contact with the long side of the insulator layer 16c on the rear side may be two or more, for example. In the electronic components 10a to 10c, the number of the lead conductor layers in contact with the long side of the insulator layer 16d on the front side and the number of the lead conductor layers in contact with the long side of the insulator layer 16d on the rear side may be two or more, for example.

As described above, preferred embodiments of the present invention are useful in electronic components, and advantageous in that a frequency or an attenuation of an attenuation pole is able to be adjusted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a multilayer body including a plurality of insulator layers laminated in a lamination direction;
    a side surface electrode provided on a side surface defined by contiguous outer edges of the plurality of insulator layers, and connected to a ground potential;
    at least one inner conductor layer provided on at least one of the plurality of insulator layers;
    a shield conductor layer provided on an insulator layer that is different from the at least one insulator layer on which the at least one inner conductor layer is provided, and overlapping with the at least one inner conductor layer when viewed from the lamination direction;

a first lead conductor layer provided on an insulator layer that is different from the insulator layer on which the shield conductor layer is provided, and connected to the side surface electrode;

a first interlayer connection conductor passing through at least one of the insulator layers among the plurality of insulator layers in the lamination direction to connect the shield conductor layer and the first lead conductor layer; and the shield conductor layer is not in contact with the side surface when viewed from the lamination direction.

2. The electronic component according to claim 1, wherein a surface positioned on one side in the lamination direction of the multilayer body is a mounting surface, when the electronic component is mounted on a circuit substrate, opposing the circuit substrate; and the shield conductor layer is positioned closer to another side in the lamination direction of the multilayer body than the at least one inner conductor layer.

3. The electronic component according to claim 1, wherein a surface positioned on one side in the lamination direction of the multilayer body is a mounting surface, when the electronic component is mounted on the circuit substrate, opposing the circuit substrate; and the first lead conductor layer is positioned closer to the one side in the lamination direction than the shield conductor layer.

4. The electronic component according to claim 1, the electronic component further comprising:

a second lead conductor layer provided on an insulator layer that is different from the insulator layer on which the shield conductor layer is provided and the insulator layer on which the first lead conductor layer is provided, and connected to the side surface electrode; and a second interlayer connection conductor passing through the insulator layer in the lamination direction to connect the shield conductor layer and the second lead conductor layer.

5. The electronic component according to claim 1, wherein the multilayer body has a rectangular or substantially rectangular parallelepiped shape;

a surface positioned on one side in the lamination direction of the multilayer body is a mounting surface, when the electronic component is mounted on the circuit substrate, opposing the circuit substrate;

the electronic component further includes:

at least one outer electrode provided on the mounting surface; and the side surface electrode is a shield electrode having a cylindrical or substantially cylindrical shape covering four side surfaces of the multilayer body adjacent to the mounting surface, and not physically connected to any of the at least one outer electrode on the surface of the multilayer body.

6. The electronic component according to claim 5, wherein the at least one outer electrode is not provided on the four side surfaces of the multilayer body adjacent to the mounting surface.

7. The electronic component according to claim 5, wherein the at least one outer electrode includes a ground outer electrode connected to a ground potential; and the shield electrode and the ground outer electrode are electrically connected with the at least one inner conductor layer interposed between the shield electrode and the ground outer electrode.

8. The electronic component according to claim 5, wherein the at least one outer electrode includes a plurality of outer electrodes; and the plurality of outer electrodes are aligned on the mounting surface from a left side to a right side thereof.

9. The electronic component according to claim 8, wherein the plurality of outer electrodes are provided only on the mounting surface of the multilayer body.

10. The electronic component according to claim 5, wherein the at least one outer electrode includes a Ni plating layer and an Sn plating layer, or an Au plating layer provided on a base electrode of Ag or Cu.

11. The electronic component according to claim 1, wherein the at least one inner conductor layer includes a plurality of inner conductor layers; and the plurality of inner conductor layers are provided in a plurality of passive elements.

12. The electronic component according to claim 11, wherein the plurality of passive elements include at least one of an LC parallel resonator, an LC series resonator, and a capacitor.

13. The electronic component according to claim 11, wherein the plurality of passive elements define a low pass filter.

14. The electronic component according to claim 1, wherein a surface positioned on one side in the lamination direction of the multilayer body is a mounting surface, when the electronic component is mounted on the circuit substrate, opposing the circuit substrate; and a direction identification mark is provided on another side in the lamination direction of the multilayer body.

15. The electronic component according to claim 1, wherein the plurality of insulator layers each have a rectangular or substantially rectangular shape with a first side and a second side that are parallel or substantially parallel to each other when viewed from the lamination direction;

a plurality of the first lead conductor layers are provided on one predetermined insulator layer among the plurality of insulator layers; and a number of the first lead conductor layers in contact with the first side of the predetermined insulator layer is equal or substantially equal to a number of the first lead conductor layers in contact with the second side of the predetermined insulator layer.

16. The electronic component according to claim 15, wherein the plurality of insulator layers each have a rectangular or substantially rectangular shape with a third side and a fourth side that are orthogonal or substantially orthogonal to the first side and the second side when viewed from the lamination direction; and a number of the first lead conductor layers in contact with the third side of the predetermined insulator layer is equal or substantially equal to the number of the first lead conductor layers in contact with the fourth side of the predetermined insulator layer.

17. The electronic component according to claim 1, wherein the at least one inner conductor layer is included in a passive element.

18. The electronic component according to claim 1, wherein the side surface electrode is provided on an entirety or substantially an entirety of the side surface.

\* \* \* \* \*